United States Patent [19]

Deguchi et al.

[11] Patent Number: 5,151,373
[45] Date of Patent: Sep. 29, 1992

[54] METHOD OF MAKING A SOLAR CELL ELECTRODE

[75] Inventors: Mikio Deguchi; Takushi Itagaki; Masaaki Usui, all of Itami, Japan

[73] Assignee: Mitsubishi Denki Kabushiki Kaisha, Japan

[21] Appl. No.: 764,363

[22] Filed: Sep. 23, 1991

Related U.S. Application Data

[62] Division of Ser. No. 482,712, Feb. 21, 1990, Pat. No. 5,084,107.

[30] Foreign Application Priority Data

Jun. 5, 1989 [JP] Japan ................. 1-142480

[51] Int. Cl.$^5$ ............................................ H01L 31/18
[52] U.S. Cl. ................................ 437/2; 136/256; 437/180; 437/181
[58] Field of Search ............................ 437/2-5, 437/180-181; 136/256

[56] References Cited

U.S. PATENT DOCUMENTS

| | | | |
|---|---|---|---|
| 3,442,007 | 5/1969 | Griffin et al. ................. | 228/179 |
| 3,888,697 | 6/1975 | Bogus et al. .................. | 136/260 |
| 4,260,429 | 4/1981 | Moyer ......................... | 136/256 |
| 4,283,591 | 8/1981 | Boer .......................... | 136/256 |
| 4,348,546 | 9/1982 | Little ......................... | 136/256 |
| 4,612,410 | 9/1986 | Hewig et al. .................. | 136/256 |
| 4,695,674 | 9/1987 | Bar-on ........................ | 136/256 |

FOREIGN PATENT DOCUMENTS

| | | | |
|---|---|---|---|
| 0201745 | 11/1986 | European Pat. Off. ........... | 136/256 |
| 3317309 | 11/1984 | Fed. Rep. of Germany ...... | 136/256 |
| 2554277 | 5/1985 | France ........................ | 136/256 |
| 55-27995 | 8/1953 | Japan ......................... | 136/256 |
| 56-91460 | 12/1954 | Japan ......................... | 136/256 |

Primary Examiner—Aaron Weisstuch
Attorney, Agent, or Firm—Leydig, Voit & Mayer

[57] ABSTRACT

An electrode structure of a solar cell includes a metal wire fixed to the light incident surface of the solar cell with an electrically conductive adhesive. An electrode production method of a solar cell includes applying an electrically conductive adhesive to at least one of a portion of a metal wire and a portion of the light incident surface of the solar cell, pressing the metal wire into a predetermined position of the light incident surface of the solar cell, and solidifying the conductive adhesive to fix the metal wire.

4 Claims, 10 Drawing Sheets

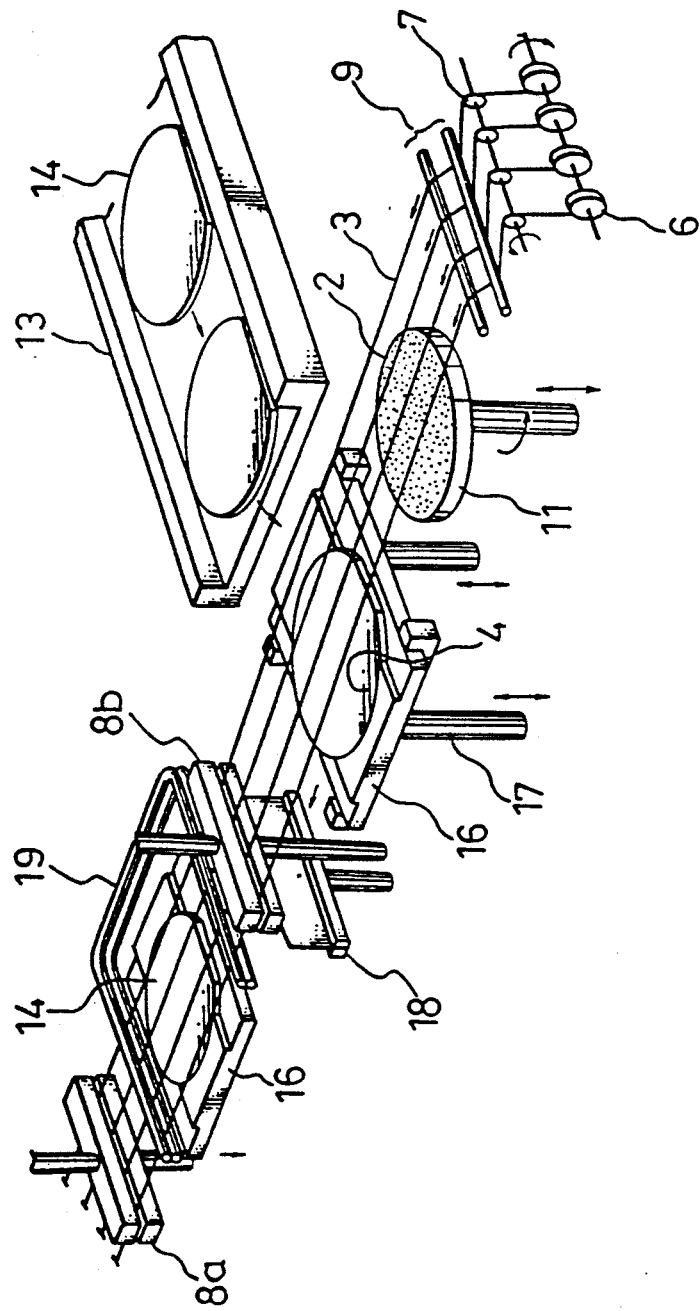

METHOD OF MAKING A SOLAR CELL ELECTRODE

This application is a division of application Ser. No. 07/482,712, filed Feb. 21, 1990, now U.S. Pat. No. 5,084,107.

FIELD OF THE INVENTION

The present invention relates to a solar cell, and, more particularly, to a method of making a solar cell electrode structure.

BACKGROUND OF THE INVENTION

In prior art solar cells, an electrode is produced by directly plating a low resistance metal on a surface of the solar cells using vacuum evaporation or sputtering or by screen printing a conductive resin on the surface of the solar cells and baking it.

FIG. 10 shows a prior art electrode production method using vacuum evaporation. In this method, a metal mask 20 having an aperture is disposed on a surface 4 of a solar cell 1. A low resistance metal 21 is heated and evaporated by irradiation with an electron beam 23 from an electron gun 22, whereby an electrode comprising a thin metal film is deposited on the surface 4 of the solar cell 1 in a high vacuum.

FIG. 11 shows another prior art electrode production method using screen printing. In this method, a conductive resin 25 is applied to the surface 4 of solar cell 1 through apertures of a screen 26 using printing means 24. The conductive resin 25 is baked, thereby producing an electrode. In this method, the electrode is thicker than in the vacuum evaporation or sputtering methods.

FIG. 12(a) is a plan view of a solar cell having a conventional electrode structure. FIG. 12(b) is a cross-section taken along line XIIb—XIIb of FIG. 12(a). In these figures, an electrode pattern 27 comprising a metal film is formed on the surface 4 of the solar cell 1 by the method described above. A conductive material 28 for conducting the photocurrent from the solar cell 1 is adhered to a predetermined portion of the metal film 27 by solder 29.

The photocurrent flows into the metal film electrode 27, to the conductive material 28, and out of the solar cell. The conductive material 28 is attached to a predetermined portion of the electrode 27 with solder or a conductive resin.

Power losses arise from the series resistances of the surface and the electrode. In order to minimize the power loss, the electrode pattern is designed using various parameters, such as sheet resistance, contact resistance between the surface and the electrode, the width, thickness, and number of electrodes, the resistivity of electrode material, and current density. The desired electrode pattern 27 is produced using the metal mask 20 or the screen mask 26.

Since the prior art electrode is produced by metal evaporation or printing of a conductive resin, the thickness of the electrode is restricted to a range from about several microns to about several tens of microns. Because of the limited thickness of the electrode, in order to minimize the power loss, the electrode needs to be wide or a large number of electrodes needs to be used. For example, when the electrode is produced by evaporation of silver (resistivity $\rho = 1.6 \times 10^{-6}$ $\Omega$·cm) to a thickness of 5 microns, in order to obtain a resistance approximately equal to that of a copper wire 50 microns in diameter, the electrode width has to be about 370 microns. When the electrode is produced by screen printing of a conductive resin including silver (resistivity $\rho = 5 \times 10^{-5}$ $\Omega$·cm ) to a thickness of 5 microns, the electrode width has to be about 1160 microns. As a result, the area of the electrode on the surface of solar cell is relatively large, reducing the effective light incidence area of the solar cell and reducing the current generating capacity of the solar cell. Moreover, the power loss at these electrodes is undesirably high.

SUMMARY OF THE INVENTION

It is an object of the present invention to provide a solar cell electrode structure that increases the effective area of the solar cell, that has reduced power loss, and that is easily mass produced.

According to an aspect of the present invention, in an electrode structure of solar cell, a metal wire is fixed to the surface of solar cell with a conductive adhesive material. Therefore, a metal wire having a large cross-sectional area and a narrow width can be connected to the surface of the solar cell, whereby the power loss at the electrode is reduced and the effective area of the solar cell is increased.

According to another aspect of the present invention, an electrode production method includes applying a conductive adhesive material in an appropriate quantity to either a portion of the surface of a metal wire or to a portion of the surface of a solar cell and mounting the metal wire in a predetermined position on the surface of the solar cell. Thereby, the area occupied by the electrode is minimized and thus the effective area of the solar cell is increased.

Other objects and advantages of the present invention will become apparent from the detailed description given hereinafter. The detailed description and specific embodiments are provided for illustration only, since various changes and modifications within the spirit and the scope of the invention will become apparent to those skilled in the art from the detailed description.

BRIEF DESCRIPTION OF THE DRAWINGS

FIG. 14 is a diagram showing a production apparatus for producing an electrode structure according to still another embodiment of the present invention.

DETAILED DESCRIPTION OF THE PREFERRED EMBODIMENTS

Figure 1:
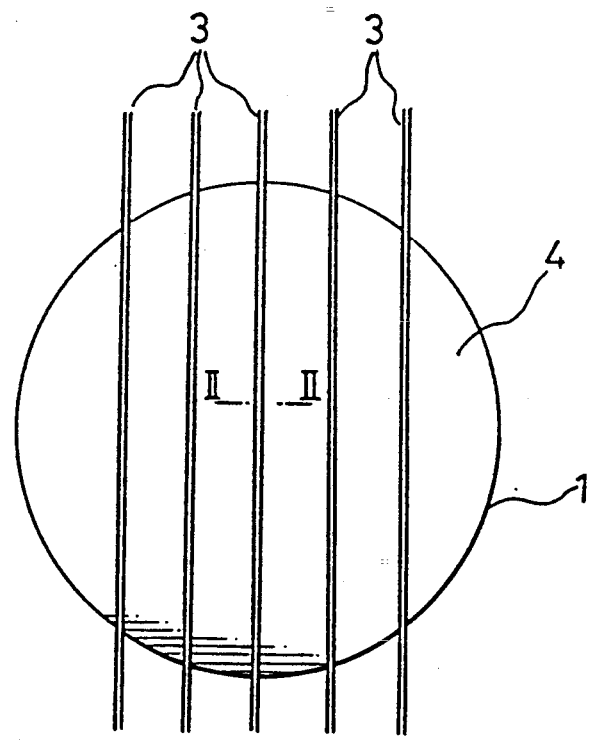
FIG. 1 is a plan view showing an electrode structure of a solar cell according to a first embodiment of the present invention.
Figure 2:
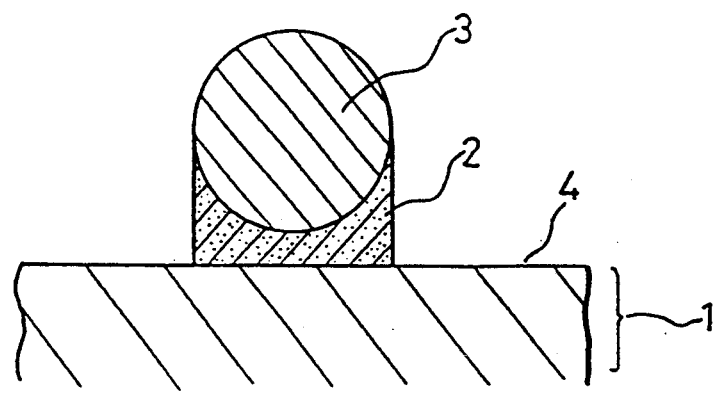
FIG. 2 is a cross sectional view taken along line II—II of FIG. 1.

FIG. 1 is a plan view of a solar cell electrode structure according to a first embodiment of the present invention. FIG. 2 is a cross-sectional view taken along line II—II FIG. 1. In these figures, a metal wire 3 has a circular cross-section and is a copper wire 50 microns in diameter. The wire 3 is mounted on the surface 4 of the solar cell 1 using a conductive adhesive material 2. This conductive adhesive material 2 is a conductive resin that is cured at a low temperature, such as a mixture of silver particles and an epoxy resin.

Figure 4:
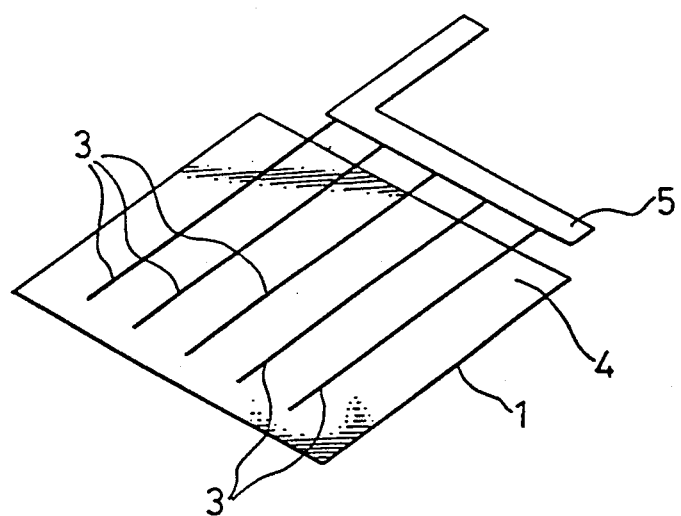
FIG. 4 is a view of the solar cell having the electrode structure of FIG. 2 according to an embodiment of the present invention.

FIG. 4 is a view of the solar cell 1 having a collection electrode 5 for collecting current flowing through the respective metal wires 3. The photocurrent generated by the solar cell 1 flows into the metal wires 3 and is collected by the collection electrode 5.

Figure 12A:
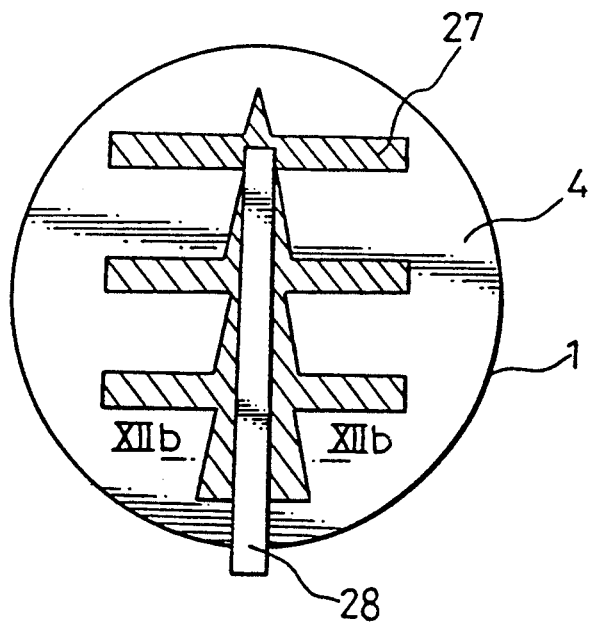
FIG. 12(a) is a plan view of an electrode structure of a solar cell according to the prior art.
Figure 12B:
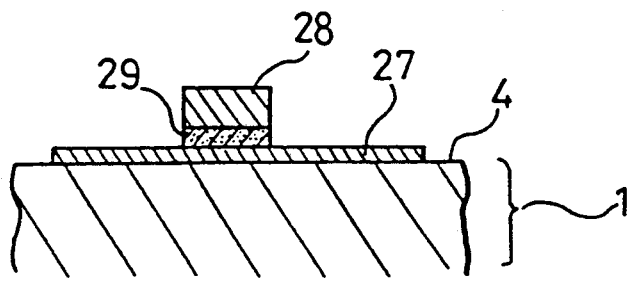
FIG. 12(b) is a cross-sectional view taken along line XIIb—XIIb of FIG. 12(a)

In the prior art electrode structure shown in FIG. 12(a), a metal pattern 27 is initially disposed on the surface 4 of the solar cell 1 by evaporation, sputtering, or screen printing, and a high conductivity metal ribbon 28 is soldered to the metal pattern. In the electrode structure according to the embodiment of the invention shown in FIG. 1, the metal wire 3 is directly connected to the surface 4 of the solar cell 1 using the conductive adhesive material.

In this embodiment, the electrodes are narrower than those of the prior art device, and the metal wire 3, having a larger cross-sectional area than the prior art electrodes, is fixed onto the surface 4 of the solar cell 1 using the conductive adhesive material 2. Therefore, the power loss at the electrode is lowered and the effective light incidence area is enlarged. For example, when the electrode is a copper wire (resistivity $\rho = 1.7 \times 10^{-6}$ $\Omega \cdot cm$) 50 microns in diameter as in this embodiment, the effective, i.e., light incident, area in a square 10 cm on a side (i.e., an area of 100 $cm^2$) is 94 $cm^2$. On the other hand, in the prior art electrode structure, when the electrode is silver (resistivity $\rho = 1.6 \times 10^{-6}$ $\Omega \cdot cm$) 5 microns thick, the width of the electrode has to be 370 microns to produce a resistance of 0.0866 $\Omega/cm$, i.e., equal to the resistance of the copper wire electrode of this embodiment. The effective, i.e., light incidence, area over a square 10 cm on a side of the silver electrode is 87 $cm^2$. This means that the light incidence area is substantially increased in the present invention.

While in the above-described embodiment a single solar cell is provided with the electrode structure of the present invention as shown in FIG. 2, several solar cells may include the electrode structure of the present invention at the same time. Furthermore, one or a plurality of solar cells provided with the electrode structure may be electrically connected to each other as a solar cell module.

While in the above-illustrated embodiment a thermosetting resin including silver particles is used as the conductive adhesive material 2, the conductive adhesive material is not restricted thereto. For example, the principal component of the conductive adhesive material may be a fusible metal, such as a solder or alloy, or the conductive adhesive material may include particles of an electrically conducting oxide, such as $SnO_2$ or ITO ($In_2O_3$, $SnO_2$).

Furthermore, the resin 2 may be a polyester resin, an acryl resin, a polyvinyl resin, or a polyurethane resin and so on, besides an epoxy resin.

While in the above-illustrated embodiment a copper wire having a circular cross-section 50 microns in diameter is used as the metal wire 3, the metal wire may have a non-circular, for example, a rectangular, cross-section.

Figure 5:
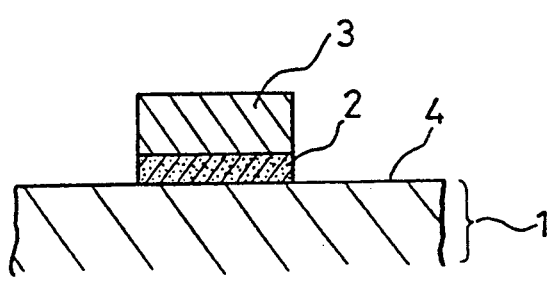
FIGS. 5 and 6 are cross-sectional views of electrode structures of a solar cell according to second and third embodiments of the present invention, respectively.

FIG. 5 shows a metal wire 3 having a rectangular cross-section. When a rectangular metal wire 3 is adhered to the surface 4 of the solar cell 1, a more stable adhesion surface is obtained than with a metal wire having a circular cross-section.

Figure 6:
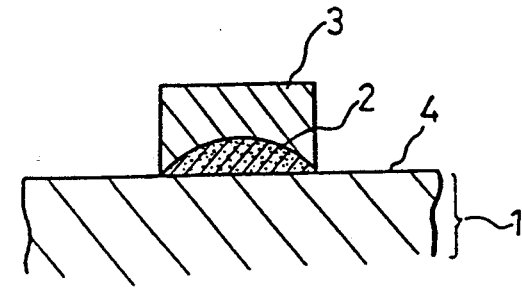

FIG. 6 shows a metal wire 3 having a concave shaped cross-section. When a concave metal wire is used, since the conductive adhesive material 2 can be disposed in the concave portion, swelling of excessive adhesive material 2, which is likely to occur while adhering the metal wire 3 onto the surface 4 of the solar cell 1, is prevented.

The metal wire 3 is not necessarily copper. Other metals or an alloy including copper as the main component may be used. Furthermore, the metal or alloy may be plated over a portion or all of the surface of the metal wire 3 to improve the adhesion of the conductive adhesive material 1.

Figure 3A:
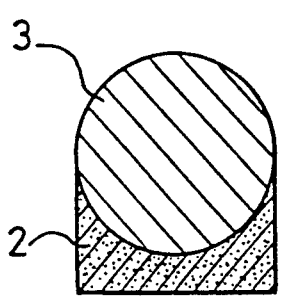
FIG. 3(a) and 3(b) are cross-sectional views illustrating a process for producing the electrode structure of FIG. 1 according to an embodiment of the present invention.
Figure 3B:
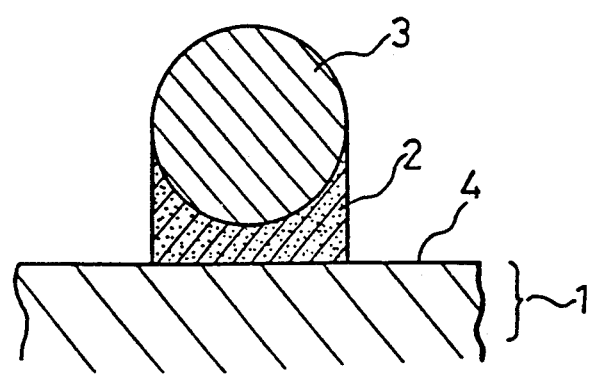

FIGS. 3(a) and 3(b) show an electrode production method according to an embodiment of the present invention. In FIGS. 3(a) and 3(b), the same reference numerals designate the same or corresponding elements as those shown in FIG. 1.

First of all, a metal 3 comprising a copper wire having a circular cross-section 50 microns in diameter is brought into contact with the conductive adhesive material 2 which has been previously spread in an appropriate thickness (FIG. 3(a)). Thus, the conductive adhesive material 2 is transcribed to the metal wire 3.

Thereafter, the metal wire 3 to which the conductive adhesive material 2 has been applied is adhered to the surface 4 of the solar cell 1. Then, this arrangement is heated in a high temperature ambient, fixing the metal wire 3 onto the surface 4 of the solar cell 1 by solidifying the conductive adhesive material 2. Thus, the electrode structure of the present invention is produced (FIG. 3(b)).

In such a production method of the present invention, since the transcribing process is used to produce the electrode, the swelling of adhesive material during adhering of the metal wire 3 to the surface 4 of the solar cell 1 is minimized.

Figure 9:
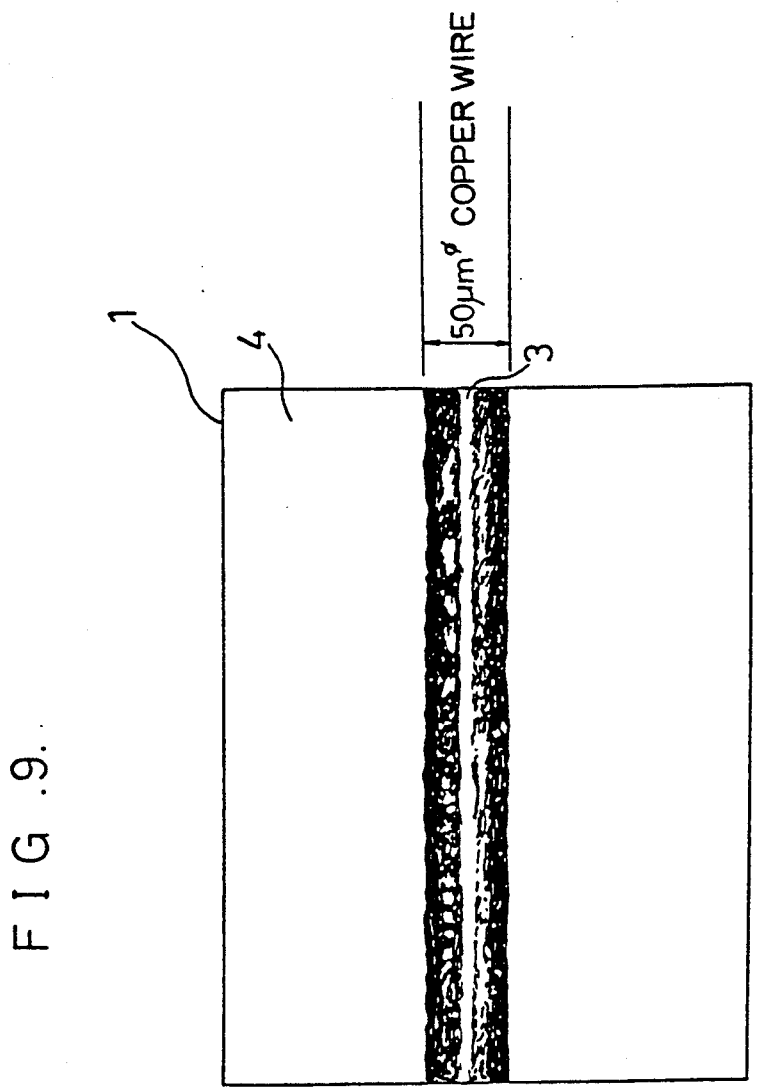
FIG. 9 is a plan view showing the adhesion of an electrode produced according to an embodiment of present invention.
Figure 10:
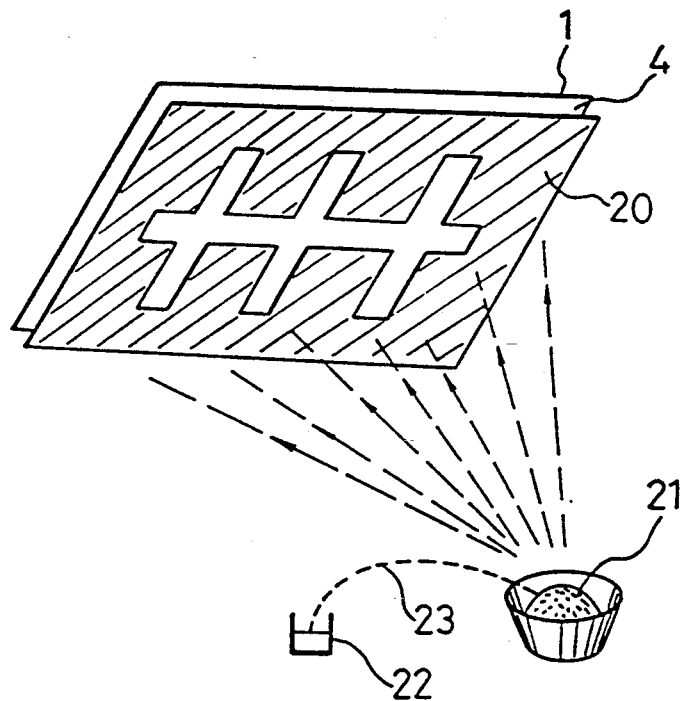
FIGS. 10 and 11 are diagrams showing production processes for producing solar cell electrodes according to the prior art.
Figure 11:
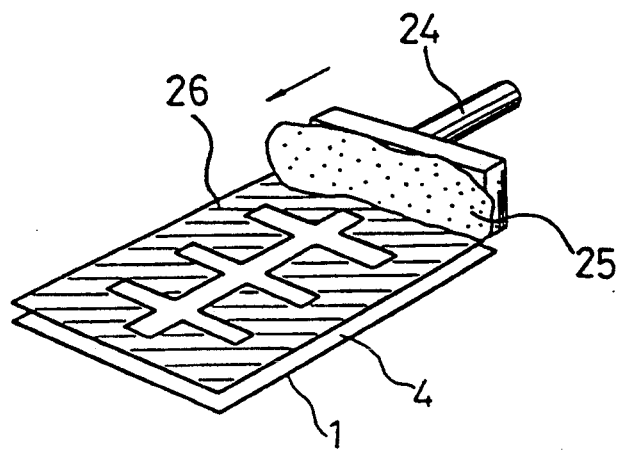
Figure 13:
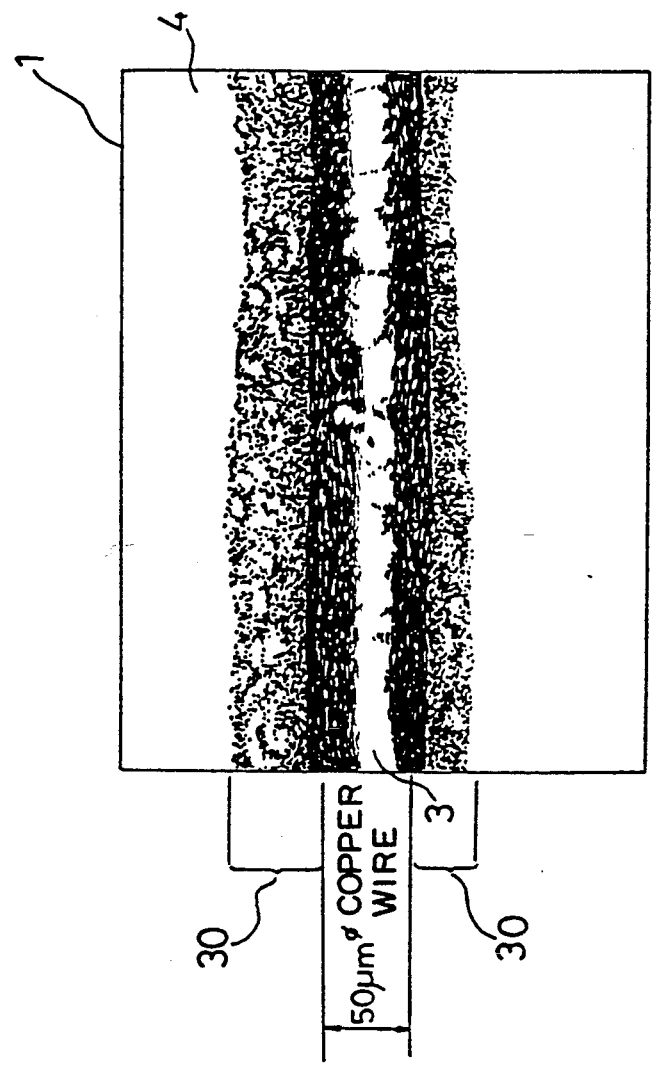
FIG. 13 is a plan view showing the adhesion of electrode produced without using a transcribing method.

FIG. 9 illustrates the adhesion of an electrode produced according to the present invention while FIG. 13 illustrates the adhesion when the metal wire 3 is fixed to the surface 4 of the solar cell 1 without using the transcribing process. In these figures, the same reference numerals designate the same or corresponding elements as those shown in FIG. 3(a), and reference numeral 30 designates a swollen portion of conductive adhesive material 2. As is apparent from FIGS. 9 and 13, while swelling of the adhesive material does not occur in the electrode production method using the transcribing process of the present invention, swollen portions 30 of adhesive material are present at both sides of the copper wire 3 of 50 microns diameter when a production method not using the transcribing process is employed. In that case, the electrode occupies a considerably larger area.

In the electrode production method of the present invention, since a transcribing process is used, the area occupied by the electrode is reduced to about ⅓ relative to the area occupied when the transcribing process is not used, whereby the effective area of the solar cell is further increased according to the invention.

While in the above-illustrated embodiment, the conductive adhesive material 2 is transcribed to the surface of metal wire 3, and thereafter this metal wire 3 is adhered to the surface 4 of the solar cell 1, the conductive adhesive material 2 may be applied to a predetermined position on the surface 4 of the solar cell 1 or it may be applied both the surface of the metal wire 3 and the surface 4 of the solar cell 1.

Furthermore, the conductive adhesive material 2 may be applied to and solidified on all or part of a predetermined region where the metal wire 3 is later to be attached. The metal wire 3 is then fixed using the conductive adhesive material 2 according to the above described production method. In this case, in order to prevent swelling of conductive adhesive material 2, the adhesive material 2 may be applied and thereafter solidified on the surface 4 of the solar cell 1 using a metal wire finer than the metal wire 3, and, thereafter, the metal wire 3 may be fixed thereon by the above-described method.

While in the above-illustrated embodiment heating is employed to solidify the conductive adhesive material because a thermosetting resin is used as the conductive adhesive material, other solidification methods may be employed according to the characteristics of the conductive adhesive material used.

Furthermore, while in the above-illustrated embodiment the device is heated in a high temperature ambient, it may be heated using the heat produced when a current flows through the metal wire 3.

Figure 7:
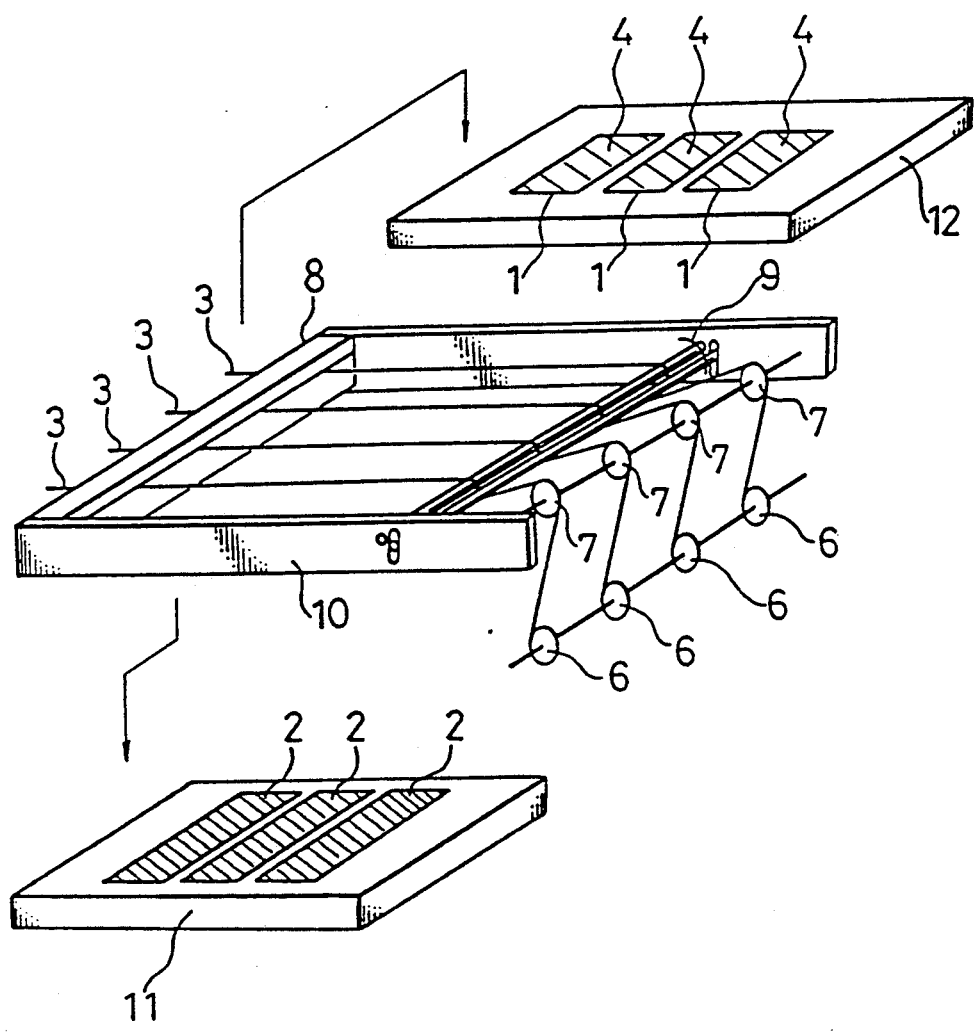
FIG. 7 is a perspective view showing a production apparatus for producing the electrode structure of FIG. 1 according to an embodiment of the present invention.

FIG. 7 shows an electrode production apparatus according to the present invention. The metal wires 3 of required length are pulled from bobbins 6 and clamped by a clamp 8 through pulleys 7. In this embodiment, four metal wires 3 are pulled and fixed at the same time. Portions of the metal wires 3 are pressed down by a tension adjusting mechanism 9, and a tension keeping the metal wires 3 straight is applied. The pulleys 7, the clamp 8, and the tension adjusting mechanism ( are incorporated in a supporting frame 10. Next, the metal wires 3 which are held by the supporting frame 10 are brought into contact with the conductive adhesive material 2 which has previously been spread in an appropriate thickness on a plate 11 in accordance with a predetermined pattern, thereby applying the conductive adhesive material 2 to the surfaces of the metal wires 3. Next, the supporting frame 10 is moved to a position above a solar cell supporting plate 12 and the frame 10 is aligned with the plate 12. Thereafter, the metal wires 3 to which the conductive adhesive material has been applied are pressed onto the surfaces 4 of the solar cells 1. Next, this assembly is heated in a high temperature ambient by a heating mechanism (not shown), whereby the conductive adhesive material 2 is solidified and the metal wires 3 are fixed to the surfaces 4 of the solar cells 1. Thereafter, the metal wires 3 are cut into appropriate lengths by a cutting mechanism (not shown) to separate the solar cells 1 from the supporting frame 10, thereby completing the production of the electrodes.

When a solar cell module including solar cells having such electrodes was subjected to an exposure test in open air, no abnormality, such as peeling, occurred after 450 days. Furthermore, under a temperature cycle test between 85° C, and −40° C. for 50 cycles, no abnormalities, such as peeling or cracks, and no welding defects were observed. These results confirm that the use of the metal wire electrode connected by the conductive adhesive material 2 is practical.

While in the above-illustrated electrode production apparatus the clamp 8, pulleys 7, and the tension adjusting mechanism 9 which are mounted in the supporting frame 10 are utilized to hold the metal wires 3 which are pulled from the bobbins 6, other structures for holding the metal wires 3 may be employed.

While in the above-illustrated embodiment four metal wires are processed at the same time, the number of metal wires may be changed in accordance with the current generated by the solar cell 1.

While in the above-illustrated embodiment the metal wire 3 is brought into contact with the conductive adhesive material 2 which is previously spread in an appropriate thickness on the plate 11 to apply the conductive adhesive material 2 to the metal wire 3, other methods may be employed.

Figure 8:
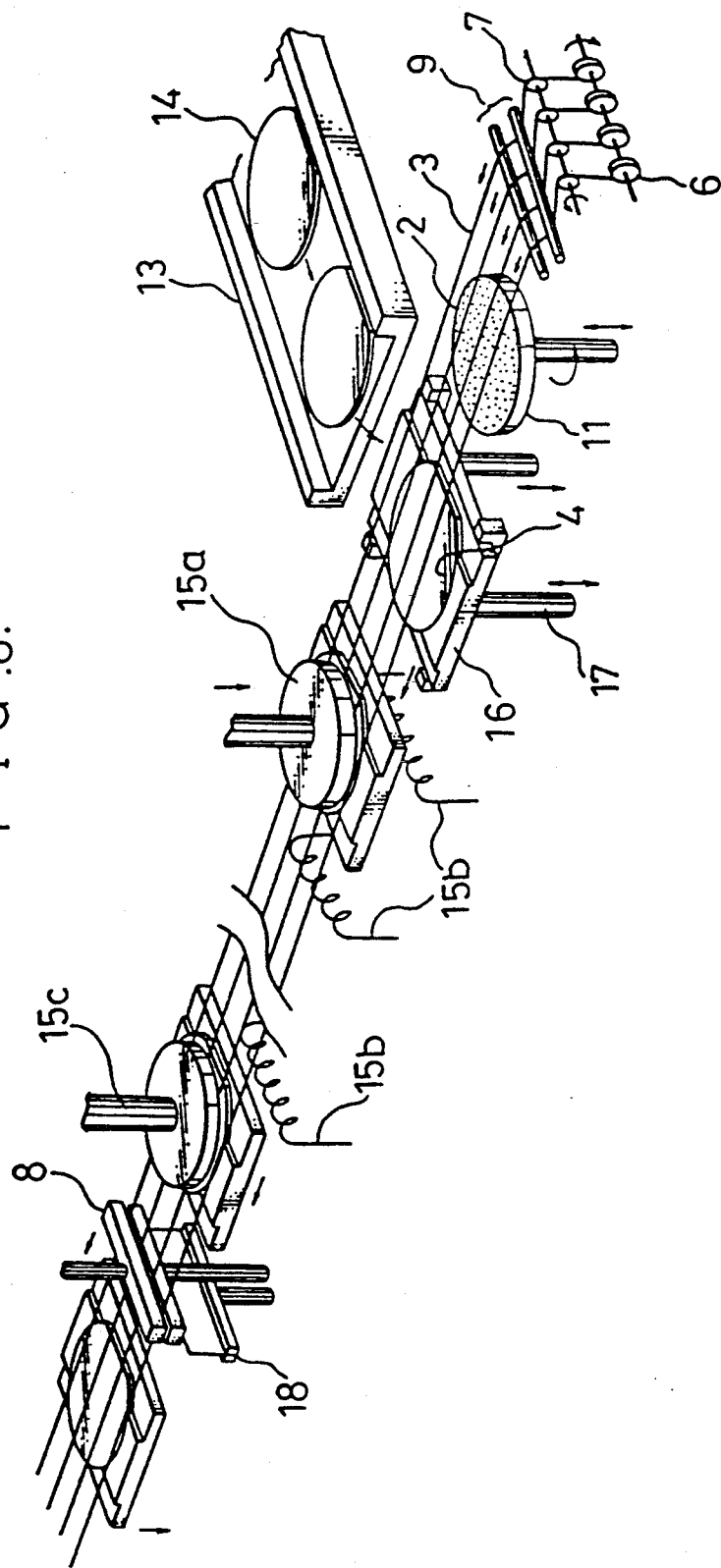
FIG. 8 is a perspective view showing further details of the apparatus of FIG. 7.

FIG. 8 shows a more complete apparatus incorporating the electrode production apparatus of Figure 7 which is useful in the actual production process. In FIG. 8, the same reference numerals designate the same or corresponding elements as those shown in FIG. 7. The metal wires 3 are pulled from the bobbins 6 and are stretched between the pulleys 7 and the clamp 8. In this embodiment, four metal wires are processed at the same time. The tension adjusting means 9 absorbs the stretching of the metal wire 3 due to, for example, heating, whereby a constant tension is applied to the metal wires 3 so that they remain straight. The metal wires 3 are successively pulled from the bobbins 6 in response to the movement of the clamp 8. A table (conductive adhesive material plating plate 11) on which the conductive adhesive material 2 is applied, comes in contact with the metal wires 3 which are pulled from the bobbins 6, and a predetermined quantity of conductive adhesive material 2 is transcribed to the lower surfaces of metal wires 3. The table 11 comes in contact with the metal wires 3 and thereafter rotates by a predetermined angle each time the conductive adhesive material is transcribed to the metal wires 3, whereby a new portion of adhesive material 2 successively comes in contact with the metal wires 3.

Solar cells 14 are continuously supplied from a solar cell supplying mechanism 13. A solar cell holder 16 is supported by a holder supporter 17. When a solar cell 14 is supplied to the solar cell holder 16 and portions of metal wires 3 to which the conductive adhesive material 2 are applied move to a position above the solar cell 14, the holder supporter 17 rises up and the surface 4 of the solar cell 14 is brought into contact with the metal wires 3. Claws for positioning the solar cell 14 are provided on the solar cell holder 16. When the solar cell 14 comes into contact with the metal wires 3, the solar cell holder 16 is moved in accordance with the movement of the metal wires 3, keeping them steady, and the solar cell holder 16 is moved from the holder plate 17 to the holder carrier mechanism (not shown).

Next, the metal wires 3 are pressed onto the surface 4 of solar cell 14 by a heating mechanism 15a, whereby they are heated. Furthermore, the solar cell 14 is heated under the solar cell holder 16 by another heating mechanism 15b. The solar cell holder 16 is carried by the holder carrier mechanism in synchronism with the movement of metal wires 3, and the upper heating mechanism 15a also moves, keeping the metal wires 3 pressed onto the solar cell 14 until solidification of the conductive adhesive material 2 is completed.

When the conductive adhesive material 2 has solidified, a second clamp holding the metal wires 3 clamps the metal wires 3 at the side of the clamp 8 where the tension adjusting means 9 is located, and the metal wires 3 at the solar cell holder 16 side of clamp 8 are cut. Thereafter, the solar cell 14 is taken out from the solar cell holder 16. Then, the solar cell holder 16 is restored to the holder supporter 17. When the metal wire 3 is cut, the second clamp holding the metal wire 3 at the cutting means 18 near the tension adjusting means 9 tensions the metal wire 3. Then, the clamper 8 may release the metal wire 3 because no tension is applied to the clamp 8 which has been holding the metal wire 3. The two clamps alternately pull and move the metal wire 3.

As discussed above, the electrode production apparatus of this embodiment successively produces a plurality of electrode structures on a plurality of solar cells according to the present invention easily and rapidly.

While in the above-illustrated embodiment the respective solar cells are separated from each other, a plurality of solar cells may be produced together.

Furthermore, while in the above-illustrated embodiment the metal wire 3 is separated after the conductive adhesive material 2 has solidified, the conductive adhesive material 2 may be solidified after the metal wire 3 is separated. In this case, as shown in FIG. 14, the metal wires 3 are pulled due to the movement of the clamp 8a, and the metal wires 3 are clamped at both sides of solar cell holder 16 by the tension maintaining means 19, thereby tightly stretching the metal wires 3. Then, the metal wires 3 at the side of solar cell holder 16 are clamped by another clamp 8b, and the metal wires 3 are cut by the cutting means 18. The separated solar cell holder and the metal wires are sent to the heating means with the tension maintaining means 19, and the conductive adhesive material 2 is then solidified. By employing such a process, the length of the extended metal wire 3 can be determined independent of the time required for the solidification.

As is evident from the foregoing description, according to the present invention, because a metal wire is fixed onto the surface of solar cell using a conductive adhesive material, an electrode having a smaller width and a larger cross-sectional area can be produced, whereby power loss at the electrode is reduced and the effective area of the solar cell is increased.

The electrode of the present invention is produced by a process in which a conductive adhesive material is applied to at least one of a portion of the surface of a metal wire or a portion of a surface of a solar cell. A metal wire is fixed to a predetermined position on the surface of the solar cell. Thereby, swelling of the conductive adhesive material is suppressed and the area occupied by the electrode is minimized, so that the effective area of the solar cell is increased.

Furthermore, the electrode production apparatus of the present invention includes means for holding the metal wire at a predetermined position, means for applying the conductive adhesive material to a predetermined position on the surface of the solar cell or the metal wire, and means for fixing the metal wire to the surface of solar cell.

The electrode structures of the present invention can be successively produced on a plurality of surfaces of solar cells. Thus, the production of the electrode structure is simplified.

What is claimed is:

1. A method of making a solar cell electrode comprising:
    applying an uncured electrically conductive adhesive to a portion of a metal wire by contacting the metal wire with a predetermined thickness of the adhesive spread on a substrate;
    pressing the metal wire toward the light incident surface of the solar cell with the uncured electrically conductive adhesive between and contacting the metal wire and the light incident surface of the solar cell; and
    while pressing the metal wire toward the light incident surface, curing the conductive adhesive, thereby bonding the metal wire to the light incident surface of the solar cell.

2. The method of claim 10 including heating the conductive adhesive to cure the adhesive while pressing the metal wire toward the light incident surface of the solar cell with the conductive adhesive therebetween.

3. The method of claim 2 including heating the conductive adhesive by passing a current through the metal wire.

4. A method of making a solar cell including:
    applying an uncured electrically conductive adhesive to at least a portion of a light incident surface of a solar cell and curing the electrically conductive adhesive on the light incident surface;
    applying an uncured electrically conductive adhesive to a portion of a metal wire by contacting the metal wire with a predetermined thickness of the adhesive spread on a substrate;
    pressing the metal wire and uncured electrically conductive adhesive on the wire against the cured electrically conductive adhesive on the light incident surface of the solar cell; and
    while pressing the metal wire toward the light incident surface, curing the uncured electrically conductive adhesive, thereby bonding the metal wire to the previously cured electrically conductive adhesive on the light incident surface of the solar cell.

* * * * *

UNITED STATES PATENT AND TRADEMARK OFFICE
CERTIFICATE OF CORRECTION

PATENT NO. : 5,151,373

DATED : September 29, 1992

INVENTOR(S) : Deguchi et al.

It is certified that error appears in the above-identified patent and that said Letters Patent is hereby corrected as shown below:

Claim 2, column 8, line 34, change "10" to --1--.

Signed and Sealed this

Twenty-eighth Day of September, 1993

Attest:

BRUCE LEHMAN

Attesting Officer

Commissioner of Patents and Trademarks